(12) United States Patent
Ogashiwa et al.

(10) Patent No.: US 9,561,952 B2
(45) Date of Patent: Feb. 7, 2017

(54) HERMETIC-SEALING PACKAGE MEMBER, PRODUCTION METHOD THEREFOR, AND HERMETICALLY-SEALED PACKAGE PRODUCTION METHOD USING THIS HERMETIC-SEALING PACKAGE MEMBER

(71) Applicant: TANAKA KIKINZOKU KOGYO K.K., Chiyoda-ku, Tokyo (JP)

(72) Inventors: Toshinori Ogashiwa, Hiratsuka (JP); Yuya Sasaki, Hiratsuka (JP); Masayuki Miyairi, Hiratsuka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 15/102,215

(22) PCT Filed: Dec. 22, 2014

(86) PCT No.: PCT/JP2014/083904
§ 371 (c)(1),
(2) Date: Jun. 6, 2016

(87) PCT Pub. No.: WO2015/098834
PCT Pub. Date: Jul. 2, 2015

(65) Prior Publication Data
US 2016/0311677 A1 Oct. 27, 2016

(30) Foreign Application Priority Data

Dec. 27, 2013 (JP) .................................. 2013-271561

(51) Int. Cl.
*H01L 23/28* (2006.01)
*B81B 7/00* (2006.01)
(Continued)

(52) U.S. Cl.
CPC ......... *B81B 7/0045* (2013.01); *B81C 1/00269* (2013.01); *B81C 1/00325* (2013.01);
(Continued)

(58) Field of Classification Search
CPC ... H01L 21/56; H01L 51/5243; H01L 51/5246
(Continued)

(56) References Cited

U.S. PATENT DOCUMENTS

| 2009/0230172 A1* | 9/2009 | Ogashiwa | H01L 24/11 228/110.1 |
| 2010/0059244 A1* | 3/2010 | Ishii | B81C 1/00269 174/50.5 |
| 2013/0111953 A1* | 5/2013 | Maloney | H01L 21/50 65/43 |

FOREIGN PATENT DOCUMENTS

| JP | 2008-28364 A | 2/2008 |
| JP | 2009-278562 A | 11/2009 |

(Continued)

OTHER PUBLICATIONS

International Search Report for PCT/JP2014/083904, Mar. 24, 2015.

*Primary Examiner* — David Vu
*Assistant Examiner* — Brandon Fox
(74) *Attorney, Agent, or Firm* — Orrick Herrington & Sutcliffe, LLP

(57) ABSTRACT

The present invention is to provide an hermetic-sealing package member including a substrate and at least one frame-like sealing material for defining a sealing region formed on the substrate, in which the sealing material is formed of a sintered body obtained by sintering at least one metal powder selected from gold, silver, palladium, or platinum having a purity of 99.9 wt % or greater and an average particle size of 0.005 μm to 1.0 μm, and with respect to an arbitrary cross-section toward an outside from the (Continued)

sealing region, a length of an upper end of the sealing material is shorter than a length of a lower end. Examples of a cross-sectional shape of the sealing material may include one formed to have a base portion having a certain height and at least one mountain portion protruding from the base portion or one formed to have a mountain portion having substantially a triangular shape in which the length of the lower end of the sealing material is a bottom. By use of the hermetic-sealing package member of the present invention, a load is reduced at the time of hermetic-sealing and a sufficient sealing effect can be obtained.

17 Claims, 6 Drawing Sheets

(51) Int. Cl.
*H01L 51/52* (2006.01)
*H01L 21/56* (2006.01)
*H01L 23/00* (2006.01)
*B81C 1/00* (2006.01)
*H01L 21/50* (2006.01)
*H01B 1/02* (2006.01)
*H01L 23/10* (2006.01)

(52) U.S. Cl.
CPC .............. *H01L 21/50* (2013.01); *H01L 21/56* (2013.01); *H01L 23/00* (2013.01); *H01L 51/5243* (2013.01); *H01L 51/5246* (2013.01); *B81C 2203/019* (2013.01); *H01B 1/02* (2013.01); *H01L 23/10* (2013.01); *H01L 24/94* (2013.01); *H01L 2924/0002* (2013.01); *H01L 2924/10253* (2013.01); *H01L 2924/167* (2013.01); *H01L 2924/16235* (2013.01); *H01L 2924/16598* (2013.01)

(58) Field of Classification Search
USPC .......................................... 257/787; 438/106
See application file for complete search history.

(56) References Cited

FOREIGN PATENT DOCUMENTS

JP          5065718 B2      12/2009
WO     WO 2007/129496 A1    11/2007

* cited by examiner (a)

(b)

(c)

HERMETIC-SEALING PACKAGE MEMBER, PRODUCTION METHOD THEREFOR, AND HERMETICALLY-SEALED PACKAGE PRODUCTION METHOD USING THIS HERMETIC-SEALING PACKAGE MEMBER

TECHNICAL FIELD

The present invention relates to a package member and a production method for the package member used for hermetic sealing of various devices such as electronic devices, and particularly to a package member useful in a production of a wafer level package in which a plurality of sealing regions are formed on a substrate.

BACKGROUND ART

Various functional devices used in electronic devices such as MEMS elements are delicate parts having a sensitive portion or a driving portion and are hermetically-sealed and packaged to prevent deterioration in function due to sticking of particles or the like in many cases. Such an hermetically-sealed package is produced in such a manner that a substrate mounted with semiconductor elements and a cover are bonded to each other by use of a sealing material, thereby being sealed.

As a sealing material used in the production of the hermetically-sealed package, a brazing material (for example, Au—Sn-based brazing material) was widely applied in the past. However, since such a brazing material had a high bonding temperature (melting temperature of the brazing material), a material capable of bonding at a lower temperature was required. Against such background, the present inventors have developed a sealing method of using a metal paste, as a technique capable of bonding at a low temperature and having excellent sealing properties (Patent Document 1). In this method, a metal paste containing predetermined metal powders is applied, and a metal powder sintered body obtained by sintering the metal paste is used as a sealing material. The metal powder sintered body is further densified when being heated and pressurized at the time of bonding (sealing) and has substantially the same densification as a bulk body, whereby it can act as a sealing material.

RELATED ART DOCUMENT

Patent Document

Patent Document 1: JP 5065718 B2

SUMMARY OF THE INVENTION

Problems to be Solved by the Invention

Meanwhile, with high performance of electronic devices in recent years, each device is required to be further downsized and thinned, and a method of implementing devices has also progressed to counteract a wafer level package from an existing method of individually packaging chips cut out from a wafer as a substrate. The wafer level package is a process to complete installation of the sealing material and assembly of the device on the wafer without separation into chips.

A sealing method of using a metal paste by the present inventors can be also basically applied to the wafer level package. With the progress of a paste applying technique, a metal paste can be applied onto a wafer in a fine pattern, and a sealing material formed of a metal powder sintered body can be obtained by sintering the metal paste. A sealing region can be formed by pressing of an upper substrate (upper wafer), on a wafer formed with the sealing material.

However, what becomes a problem here is an increase of a pressing load at the time of a sealing process (bonding process by a sintered body) due to an increase in the number of packages on the wafer. As described above, the sealing by the metal powder sintered body is achieved by heating and pressurizing, and it is necessary to sufficiently densify the metal powder sintered body by pressurizing the wafer at the time of sealing is necessary. A pressing load to be required at this time increases depending on a cross-sectional area (sealing area) of the sealing material (metal powder sintered body). Since the sealing area is proportional to the number of packages, the increase in the number of packages leads to an increase in the pressing load, whereby a load on the wafer bonding device becomes larger and sometimes exceeds the specification of the device. It is originally an objective of the wafer level package to cope with high-density mounting of the package; however, when the metal powder sintered body is used as a sealing material, if there is a need for setting a sealing region while a pressing load is suppressed, and thus there is a possibility that its merit cannot be sufficiently obtained.

The present invention was made against the above background, and provides a technique of reducing a load and exhibiting a sufficient effect at the time of hermetic-sealing of a hermetically-sealed package which is hermetically-sealed using a metal powder sintered body as a sealing material.

Means for Solving the Problems

First, the present inventors made a study of reconfirming a densifying mechanism in a metal powder sintered body to solve the above problems. A sealing material made of the metal powder sintered body by the present inventors increases in densification by pressurization even after metal powders are formed as a sintered body by use of characteristics based on purity and particle size of the metal powders to be applied. The increase in densification by the pressurization results from a change in a metal structure due to recrystallization caused by thermal energy to be applied by pressurization and heating in addition to a physical change that is plastic deformation and bonding of metal particles (powders). The change that is the plastic deformation and recrystallization of the metal powders occurs when the sintered body is pressurized and compressed in a state of being constrained in a vertical direction.

Therefore, when the sealing material is pressurized against upper and lower substrates while coming in contact with the upper and lower substrates in a partial range, plastic deformation and recrystallization of the metal powders should also partially occur inside the sealing material. It is considered that a low load is required. The present inventors have completed the present invention, based on this consideration, by adjusting the shape of the metal powder sintered body to form the sealing material and finding a state of having a sealing effect even at low weighting.

That is, the present invention is an hermetic-sealing package member including a substrate and at least one frame-like sealing material for defining a sealing region formed on the substrate, wherein the sealing material is formed of a sintered body obtained by sintering at least one metal powder selected from gold, silver, palladium, or platinum having a purity of 99.9 wt % or greater and an average particle size of 0.005 μm to 1.0 μm, and with respect to an arbitrary cross-section toward the outside of the region from the sealing region, a length of an upper end of the sealing material is shorter than a length of a lower end.

The present invention will be described below in detail. In the hermetic-sealing package member of the present invention, with respect to a cross-sectional shape of the frame-like sealing material set on the substrate, a length of an upper end coming in contact with an upper substrate to be bonded is formed to be shorter than a length of a lower end coming in contact with the substrate (FIG. 1(a)). With respect to the cross-sectional shape of the sealing material made of a metal powder sintered body, when the length of the upper end is made short, if the upper substrate is pressed at the time of sealing, the upper substrate is compressed from an apex portion of the upper end, metal powders immediately below the upper substrate deform, and thus a recrystallized region is formed (FIG. 1(b)). By the continuous pressing of the upper substrate, the recrystallized region expands, and a pillar recrystallized region is formed (FIG. 1(c)). The pillar recrystallized region has a sealing effect of being densified with respect to the surrounding metal powder sintered body, and thus airtightness of the sealing region can be ensured.

Since the upper substrate partially comes in contact with the sealing material during the formation of the above pillar recrystallized region, the recrystallization can happen at a low load compared to a conventional method in which an entire surface of the flat sealing material is recrystallized in total by pressing. Accordingly, the present invention allows forming of a sealing region while a pressing load of the upper substrate is suppressed. The present invention will be described below in detail.

The sealing material in the present invention is entirely formed of a sintered body of metal powders. Although a process of forming the sintered body will be described below in detail, the sintered body is obtained by sintering the metal powders containing at least one metal selected from gold, silver, palladium, or platinum having the purity of 99.9 wt % or greater and the average particle size of 0.005 μm to 1.0 μm. With respect to conditions of the metal powders used to form the sintered body, the high-purity metal is required because when the purity is low, there are concerns that hardness of the powders increases and the metal powders hardly deforms and recrystallizes after being formed into the sintered body, thereby not exhibiting a sealing action. Additionally, as described below, the sintered body is formed by use of a metal paste containing the metal powders and a solvent, and the metal paste does not contain glass frit. Thus, the formed sealing material is formed of a high-purity metal similarly to the powder. Specifically, the sealing material is formed of a metal having the purity of 99.9 wt % or greater.

Whether the pillar recrystallized region can be formed or not by the compression of the upper end of the sealing material and a dimension (width) of the recrystallized region are affected by a relative density of the sealing material. When the density of the sintered body constituting the sealing material is low, plastic deformation and bonding of the metal powders hardly occur even when the metal powders are subjected to the compression, and thus the formation of the recrystallized region is difficult, or a width sufficient to the expectation for the sealing effect is hardly formed. The relative density of the sintered body constituting the sealing material is preferably 60% or more with respect to a bulk body (bulk material produced to have the same composition by casting, plating, or the like) of metal particles to be constituted. Particularly, 70% or more is preferable, and when the sintered body having the density close to that of the bulk body is applied in this way, the width of the recrystallized region to be formed is similar to the width of the compressed portion.

Here, the cross-sectional shape of the sealing material in the present invention is formed to include a base portion having a predetermined height and at least one of mountain portions protruding from the base portion. As described above, this is because the sealing region can be formed while the pressing load is reduced.

As a dimension and a shape of the mountain portion in such a cross-sectional shape, a ratio (h'/h) of a height (h') of the mountain portion to a height (h) of the base portion is preferably 0.2 to 5.0 (FIG. 2). When the ratio is less than 0.2, a compression amount of the mountain portion due to stress concentration is small, and an effect of recrystallization due to partially plastic deformation of the mountain portion is impaired. Additionally, when the ratio exceeds 5.0, vertically compressing the sealing material is difficult.

Further, the width of the mountain portion formed on the base portion affects the width of the recrystallized region, and the number of mountain portions affects the number of recrystallized regions. At least one mountain portion is required to be formed, but a plurality of mountain portions are preferably formed to form the plurality of recrystallized regions as a backup.

At least one mountain portion is necessary to be consistently formed in an arbitrary cross-section toward the outside from the sealing region. Therefore, an apex of the mountain portion frequently traces a continuous path when being viewed in a plane parallel to a planar surface of the substrate, and the recrystallized region is formed along the path. The path traced by the apex of the mountain portion may be parallel to an outer edge of the base portion of the sealing material or may have a concentric shape or the like, but is preferably a net shape or a grid shape in which the apex paths cross to each other (FIG. 3), because the recrystallized region can be comprehensively formed in all cross-sectional directions.

When the height of the mountain portion is in the range of the ratio with respect to the height of the above base portion, the height of the mountain portion does not have to be equal at all times. For example, when the apex paths is in the net-like shape, a height of an intersection portion of the path is defined as a peak, and a mountain portion having a height lower than the peak may be formed between intersections (refer to an embodiment to be described below). Furthermore, regarding the cross-sectional shape of the mountain portion, an inclined surface (ridge) formed toward a lower end from the apex may be in a straight line or a curved line (FIG. 4).

As the cross-sectional shape of the sealing material in the present invention, in addition to the above-described shape, a mountain portion having substantially a triangular shape having a length of the lower end of the sealing material as a bottom may be formed (FIG. 5). The cross-sectional shape of the sealing material is simple and one recrystallized region is formed by compression; however, for example, when the sealing regions are necessary to be minimized, such a cross-sectional shape is preferred as a cross-sectional shape of the sealing material.

With respect to the sealing material having such a cross-sectional shape of only the mountain portion, a ratio (h"/L) of a height (h") of the mountain portion to a length (L) of the bottom is preferably 0.1 to 3.0, because when the height of the mountain portion is too low, increasing a load is necessary to make the compression amount of the mountain portion large. The apex of the mountain portion does not need to be located in the center of the bottom, and may be located toward either the left or right side of the bottom. Additionally, the height of the mountain portion may not be equal, and may be in the range of the above ratio.

In the present invention, the cross-sectional shape of the sealing material is defined as described above, but the planar shape of the sealing material is not particularly limited as long as having a frame shape to delimit the sealing region on the substrate. The frame shape can assume, for example, circularity or rectangle.

The substrate in the present invention is a member that needs to form at least one sealing region on the surface of the substrate, and may be a resin substrate as well as a silicon wafer or a metal wafer. Semiconductor elements are disposed in advance inside the sealing region formed on the substrate.

The sealing material may be directly formed on the substrate; however, an underlying metal film is formed on the surface of the substrate and then the sealing material may be formed on the underlying metal film. The underlying film is used to improve adhesion between the metal powder sintered body serving as the sealing material and the substrate, and by setting the underlying film, appropriate recrystallization can be induced when a uniform pressure is applied to the sintered body. The underlying film is preferably formed of any metal of gold, silver, palladium, platinum, titanium, chromium, tungsten, titanium-tungsten alloy, or nickel, and preferably has high purity (99.9 wt % or greater). Additionally, the underlying film is preferably formed of a metal of the bulk body to ensure the adhesion with respect to the sealing material, and is preferably formed by, for example, plating (electrolytic plating or electroless plating), sputtering, deposition, or a CVD method. The metal film may have either of a single layer structure or a multilayer structure, but a metal of a layer coming in contact with the sealing material is preferably similar to the metal of the metal powder.

Next, a production method for the hermetic-sealing package member of the present invention and a sealing method of the package will be described. The hermetic-sealing package member of the present invention can be produced in such a manner that a metal paste having a predetermined configuration is applied onto the substrate in a frame shape and is then fired.

The metal paste for forming the sealing material basically includes at least one metal powder selected from gold, silver, palladium, or platinum having the purity of 99.9 wt % or greater and the average particle size of 0.005 µm to 1.0 µm and an organic solvent. The purity of the metal powders is set to be 99.9 wt % or greater in the light of ensuring conductivity in addition to deformability and recrystallization when the metal powders are formed into the sintered body as described above. Furthermore, the average particle size of the metal powders is set to be 0.005 µm to 1.0 µm because, when metal powders having a particle size exceeding 1.0 µm are filled in a fine through-hole, a large gap occurs and electric conductivity to be required cannot be ultimately ensured; and that metal powders having a particle size of less than 0.005 µm are easily aggregated in the metal paste and are hardly filled in a through-hole.

Preferable examples of the organic solvent used in the metal paste include ester alcohol, terpineol, pine oil, butyl carbitol acetate, butyl carbitol, carbitol, isobornyl cyclohexanol (for example, product name of Tersorb MTPH: produced by Nippon Terpene Chemicals, Inc.), 2,4-diethyl-1,5-pentanediol (for example, product name of NKY MARS (produced by The Nippon Koryo Yakuhin Kaisha. Ltd.), and dihydroterpineol (for example, product name of NKY MHD, produced by The Nippon Koryo Yakuhin Kaisha. Ltd.).

With respect to a mixing ratio between the metal powders and the organic solvent of the metal paste to be applied, the amount of metal powders is preferably 80 to 99 wt %, and the amount of organic solvent is preferably 1 to 20 wt %. The ratio is set to prevent aggregation of the metal powders and also supply the metal powders sufficient to form the sealing material.

The metal paste used in the present invention may contain additives. Examples of the additives may include at least one selected from acrylic resin, cellulose resin, or alkyd resin. For example, the acrylic resin may include a methyl methacrylate polymer, the cellulose resin may include ethyl cellulose, and the alkyd resin may include phthalic anhydride resin. These additives have an effect of suppressing aggregation of the metal powders in the metal paste and make the metal paste homogeneous. The amount of additives to be added is preferably in the proportion of 2 wt % or less with respect to the metal paste. Thus, the metal powders can be filled in the through-hole with a sufficient amount while a stable aggregation suppressing effect is maintained.

However, the metal paste used in the present invention differs from a general metal paste which is widely used for formation of electrode and wiring patterns, and does not contain glass frit. In the present invention, the reason of not mixing the glass frit with the metal paste is to form a frame-like sealing material, which is fine and dense, and is to prevent residual of impurities which may inhibit recrystallization. Since a component such as the organic solvent, other than the metal powders, constituting the metal paste disappears in a process of drying or sintering after the filling, the organic solvent does not act as an inhibitory factor as the glass frit.

When the metal paste is applied onto the substrate, a mask having a mesh-like opening for forming the sealing material is placed on the surface of the substrate, the metal paste is applied to the mask, and the metal paste is filled in the opening. The planar shape of the opening of the mask has preferably a frame shape similar to the shape of the sealing material. In the present invention, the mask having the mesh-like opening is applied, but the mask is intended to form the mountain portion of the sealing material.

Processes of forming the mountain portion are described in FIGS. 6(a) to 6(c). Meshes are provided in the opening of the mask in a state of having a certain height with respect to the surface of the substrate. The metal paste is filled up to at least a height of the opening coming in contact with the meshes (FIG. 6(a)). After the filling of the metal paste is completed, the mask is removed; however, at this time, when the meshes are pulled up, the surface is in a state of being raised by the action of surface tension of the metal paste (FIG. 6(b)), and a mountain portion is formed when the mask is completely pulled up (FIG. 6(c)).

A height of the mountain portion formed by use of the surface tension of the metal paste as described above is adjusted by viscosity of the metal paste. From the viewpoint of the viscosity, a preferred metal paste has a thixotropy index (TI) value of 3 to 15 which is calculated from a measurement value of viscosity at a shear rate of 4/s with respect to viscosity at a shear rate of 40/s at 23° C. by use of a rotation viscometer and viscosity of 30 to 1000 Pa·s at a shear rate of 4/s. The viscosity of the metal paste can be adjusted by selection of the organic solvent, the mixing ratio of the metal powders and the organic solvent, the presence or absence of additives, and the amount of additives to be added. A more preferred metal paste has a thixotropy index value of 5 to 10 and viscosity of 100 to 800 Pa·s at a shear rate of 4/s.

The mesh pattern in the opening of the pattern portion corresponds to the path of the apex of the mountain portion of the sealing material in plane view. At this time, a wire diameter of the mesh is preferably 10 to 25 μm, and an opening of a hole is preferably 20 to 70 μm. The mesh may be formed by weaving of thin wires, but may be produced by plating, electro-forming, etching, or the like. Further, the thickness of the mask is preferably set to be 2 to 50 μm. Examples of materials of the mask may include photosensitive emulsion which is generally used or a metal foil, for example, a nickel foil for increasing resistance against the solvent contained in the paste.

A method of applying the metal paste onto the substrate is not particularly limited. Additionally, after the metal paste is applied, the metal paste is preferably dried. The drying is preferably performed at a temperature of 150 to 250° C. or lower.

A heating temperature is preferably set to be 150 to 300° C. at the time of sintering the metal paste, because when the heating temperature is lower than 150° C., the metal powders cannot be sufficiently sintered; and when the heating temperature exceeds 300° C., the sintering excessively proceeds and necking between the metal powders occurs, whereby the metal powders become too hard. Additionally, as an atmosphere at firing, for example, air, an inert gas (nitrogen, argon, or helium), or an inert gas obtained by a mixture of hydrogen of 1 to 5% is selected. Further, a firing time is preferably set to be 30 minutes to 8 hours, because when the sintering time is too long, the sintering excessively proceeds and necking between the metal powders proceeds, and whereby the metal powders become problematically too hard.

By applying and sintering the metal paste as described above, the sealing material is formed in which the metal powder are sintered and solidified, and the hermetic-sealing package member of the present invention is produced.

The sealing method of the package of the present invention is to produce the hermetic-sealing package member in the above manner, to overlap the substrate of the hermetic-sealing package member and another substrate through the sealing material to each other, and to densify the sealing material by heating and pressing at the same time. The "another substrate" may be the same as or different from, in material and size, the substrate of the hermetic-sealing package member of the present invention. Additionally, the "another substrate" may be a device such as a semiconductor element.

As heating and pressing conditions at this time, a heating temperature is preferably set to be 80 to 300° C., because the temperature range advances recrystallization of the metal powders while the damage of the substrate or elements on the substrate is suppressed. Preferably, the heating temperature is set to be 150 to 250° C.

A heating and pressing treatment time is preferably set to be 0.5 to 3 hours after the reach of a set heating temperature. By the heating and pressing treatment, the mountain portion of the sealing material is crushed, and the metal powders are preferentially plastically-deformed and recrystallized at the base portion near directly below the mountain portion, thereby being densified. In the recrystallized region formed in this way, since the upper substrate and the sealing material partially come in contact with each other, hermetic sealing is established at a low load compared to the conventional method in which the entire surface of the sealing material is recrystallized in total by pressing.

Advantageous Effects of the Invention

As described above, in the hermetic-sealing package member of the present invention, reliable hermetic sealing can be obtained while pressing load is reduced even when a plurality of sealing regions are set on a substrate. In the hermetic-sealing method of the present invention, a plurality of regions can be hermetically sealed by a relatively simple process by use of a predetermined metal paste, and thus the hermetic-sealing method can be expected to be applied to a wafer level package.

DESCRIPTION OF EMBODIMENTS

Preferred embodiments of the present invention will be described below.

First Embodiment

A silicon wafer having a diameter of 4 inches was prepared as a substrate, and a three-layered metal film of Ti (0.05 μm)/Pt (0.01 μm)/Au (0.2 μm) (Ti being provided toward a surface of the wafer) was formed, as an underlying film, on a surface of the silicon wafer by a sputtering method.

Then, a metal paste serving as a raw material of a sintered body was adjusted to form a sealing material. A metal paste was used which was adjusted by mixture of 96 wt % metal powders produced by a wet reduction method and 4 wt % isobornyl cyclohexanol (MTPH) being an organic solvent. In this embodiment, a metal paste of each metal powder such as gold, silver, palladium, or platinum was prepared.

Viscosity of each metal paste, which has been adjusted, was measured in advance. With a cone-type rotation viscometer (Rheostress RS75 manufactured by HAAKE GmbH, (cone plate: made of titanium and having a diameter of 35 mm, and a gap being set to be 0.05 mm)), the viscosity of each metal paste was continuously measured in such a manner each metal paste was maintained for 30 seconds at respective shear rates of 4/s, 20/s, and 40/s in this order, at a measurement temperature of 23° C. A thixotropy index (TI) value was calculated on the basis of the measured value from the following equation.

TI=(viscosity at shear rate of 4/s)÷(viscosity at shear rate of 40/s)

The metal paste was applied onto the substrate. In this embodiment, 10 rectangular sealing regions made of the sealing material having a width of 300 μm and a pattern shape of 10 mm-square were set on the wafer. The metal paste was applied through a screen mask (suspend metal mask) along the pattern of the sealing material. The screen mask (product name: ESP metal mask, Taiyo Kagaku Corporation) used herein is obtained in such a manner that an emulsion part of a general emulsion mask is substituted for Ni foil metal. The Ni foil has a thickness of 30 μm and is provided with meshes of a hole density of 500, which are woven by metal wires having a diameter of 16 μm, on an upper surface of an opening, wherein an opening of a hole is 33 μm.

The metal paste was applied onto the wafer by a screen printing in a state where the metal mask was placed on the wafer. After the metal paste was filled in an opening of the metal mask, the metal mask was moved upward in an approximately vertical direction, and thus a mountain portion was formed by the meshes provided in the opening.

Figure 7:
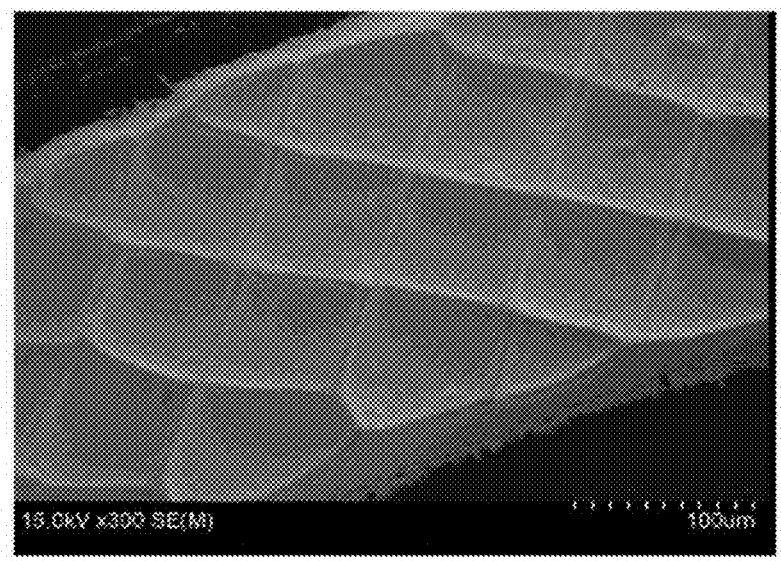
FIG. 7 is a photograph showing an appearance of a sealing material produced in a first embodiment.
Figure 7:
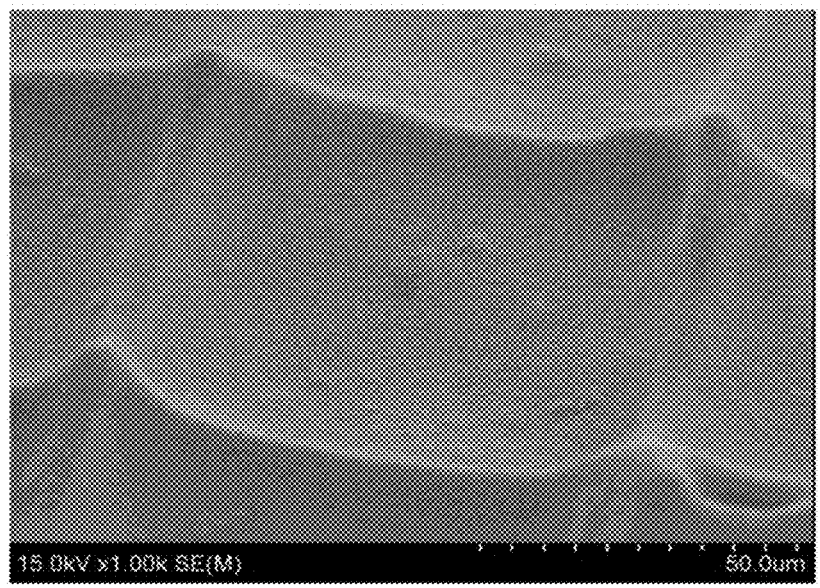

After being applied, the metal paste was dried at 150° C., and thus a solvent and gas components contained in the metal paste were removed. Thereafter, the metal paste was fired under nitrogen −4% hydrogen atmosphere of 200° C., and thus a solvent and gas components contained in the metal paste were removed. An appearance of the sealing material obtained after the sintering is showed in FIG. 7. A cross section of the sealing material was observed with a scanning electron microscope to obtain an image of the cross section, the image was subjected to binarization processing by image analysis, and thus a relative density of the sealing material was calculated on the bases of a ratio of a pore portion and a non-pore portion.

Similarly, a silicon wafer of 4 inches serving as an upper substrate formed with the underlying film of Ti (0.05 μm)/Pt (0.01 μm)/Au (0.2 μm) was hermetically-sealed by boding to the hermetic-sealing package member produced in the above manner. In a vacuum atmosphere, the wafer was placed on the sealing material of the hermetic-sealing package member set on a heater. After a load was applied to the wafer from the above, the wafer was heated to 200° C. at a temperature rising rate of 30° C./min and was kept for 30 minutes after the reach of 200° C.

The load was removed after the heating and pressing of the wafer at 200° C. for 30 minutes, and a helium leak test (bell jar method) was performed to confirm airtightness of the sealing region inside the sealing material. In this evaluation, helium leak was acceptable when being $10^{-9}$ Pa·m$^3$/s or less.

In this embodiment, the airtightness inside the sealing region was examined in such a manner that the wafers were bonded to each other by a change of a pressing load during the hermetic-sealing for each metal of the metal paste. Additionally, for comparison with the conventional example, the package member having an upper surface on which a flat sealing material was formed was produced, and airtightness of the package member was also confirmed. In the conventional example, a metal paste was used similarly to this embodiment, the metal paste was dried and fired after being formed into a pattern having a height size of 20 μm by metal mask printing to have a planar shape (sealing material having a width of 300 μm and a pattern shape of 10 mm-square) in the same manner as in this embodiment, and then a rectangular frame-like sealing material was formed. The wafers were hermetically-sealed by bonding to each other under the same condition as in this embodiment. The results are indicated in Table 1.

TABLE 1

| | Metal paste | | | | | Sealing material*[1] | | | | | Result of sealing test | |
|---|---|---|---|---|---|---|---|---|---|---|---|---|
| | | | | | | | Mountain portion | | | | | |
| | | Purity of metal | Particle size of metal | Paste characteristics | | | Number of mountain | Height of mountain portion*[4] | | Height of base | Relative | Pressing load*[2] | Leak rate (Pa· |  |
| | Metal powder | powder | powder | TI | Viscosity (at 4/s) | Cross-sectional shape | portions | Maximum | Minimum | portion | density | | m$^3$/s) | Determination |
| 1 | Au | 99.9% | 0.3 μm | 6 | 730 | Base portion + mountain portion | 3 | 30 μm | 20 μm | 10 μm | 71% | 12 kN | $10^{-11}$ to $10^{-13}$ | Acceptable |
| 2 | | | | | | | 3 | 30 μm | 20 μm | 10 μm | 69% | 9.6 kN | $10^{-11}$ to $10^{-13}$ | Acceptable |
| 3 | | | | | | | 3 | 30 μm | 20 μm | 10 μm | 70% | 7.2 kN | $10^{-9}$ to $10^{-11}$ | Acceptable |
| 4 | | 99.0% | 0.3 μm | 6 | 720 | | 3 | 30 μm | 20 μm | 10 μm | 73% | 7.2 kN | $10^{-6}$ to $10^{-8}$ | Not Acceptable |
| 5 | | 99.9% | 1.2 μm | 6 | 730 | | 3 | 30 μm | 20 μm | 10 μm | 70% | 7.2 kN | $10^{-6}$ to $10^{-8}$ | Not Acceptable |
| 6 | | 99.9% | 0.3 μm | 6 | 730 | Rectangular shape*[3] | — | — | — | — | 72% | 12 kN | $10^{-11}$ to $10^{-13}$ | Acceptable |
| 7 | | | | 6 | | | | | | | 72% | 7.2 kN | $10^{-6}$ to $10^{-8}$ | Not Acceptable |
| 8 | Ag | 99.0% | 0.3 μm | 6 | 730 | Base portion + mountain portion | 3 | 30 μm | 20 μm | 10 μm | 65% | 7.2 kN | $10^{-11}$ to $10^{-13}$ | Acceptable |
| 9 | | 99.9% | 0.3 μm | 6 | 720 | Rectangular shape | — | — | — | — | 66% | 7.2 kN | $10^{-6}$ to $10^{-8}$ | Not Acceptable |
| 10 | Pd | 99.0% | 0.3 μm | 6 | 730 | Base portion + | 3 | 30 μm | 20 μm | 10 μm | 73% | 9.6 kN | $10^{-11}$ to $10^{-13}$ | Acceptable |

TABLE 1-continued

| | Metal paste | | | | Sealing material*1 | | | | | | Result of sealing test | |
|---|---|---|---|---|---|---|---|---|---|---|---|---|
| | | | | | | Mountain portion | | | | | | |
| Metal powder | Purity of metal powder | Particle size of metal powder | Paste characteristics TI | Viscosity (at 4/s) | Cross-sectional shape | Number of mountain portions | Height of mountain portion*4 Maximum | Minimum | Height of base portion | Relative density | Pressing load*2 | Leak rate (Pa · m³/s) | Determination |
| 11 | 99.9% | 0.3 μm | 6 | 730 | mountain portion Rectangular shape | — | — | — | — | 74% | 9.6 kN | $10^{-6}$ to $10^{-8}$ | Not Acceptable |
| 12 Pt | 99.0% | 0.3 μm | 6 | 730 | Base portion + mountain portion | 3 | 30 μm | 20 μm | 10 μm | 73% | 9.6 kN | $10^{-11}$ to $10^{-13}$ | Acceptable |
| 13 | 99.9% | 0.3 μm | 6 | 730 | Rectangular shape | — | — | — | — | 73% | 9.6 kN | $10^{-6}$ to $10^{-8}$ | Not Acceptable |

Figure 1:
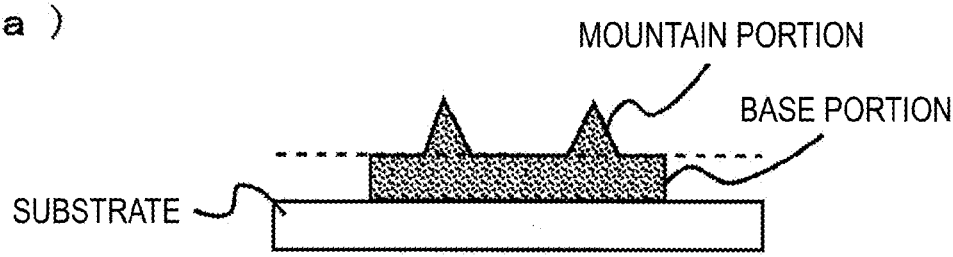
FIGS. 1(a) to 1(c) are views illustrating processes of forming a recrystallized region in a sealing material of the present invention.
Figure 1:
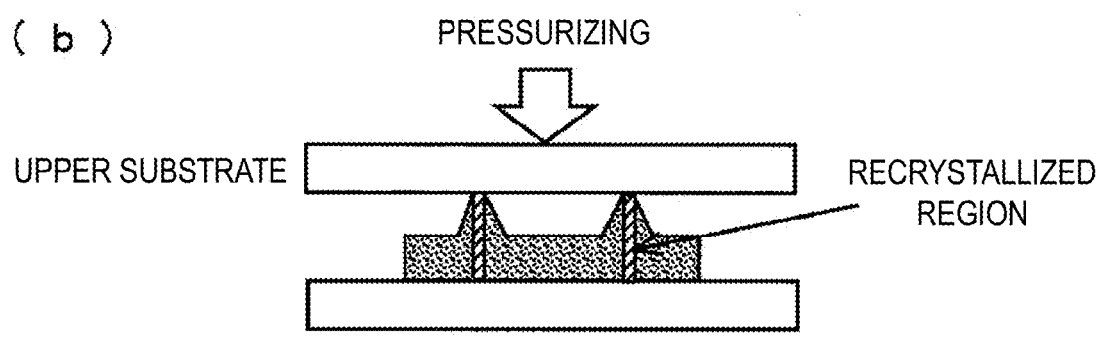
Figure 1:
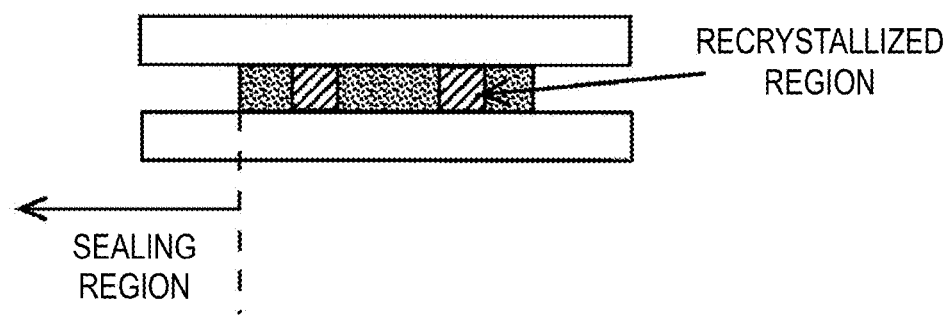
Figure 2:
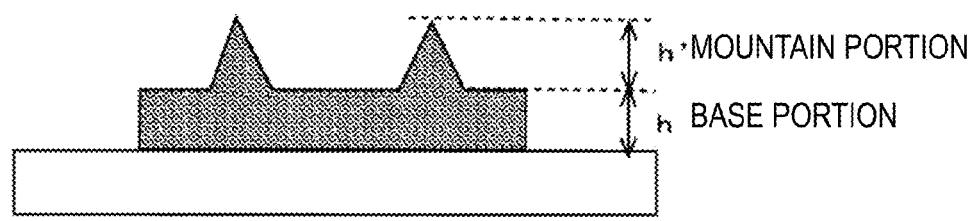
FIG. 2 is a view illustrating a dimension of a mountain portion of a sealing material having a base portion and the mountain portion.
Figure 3:
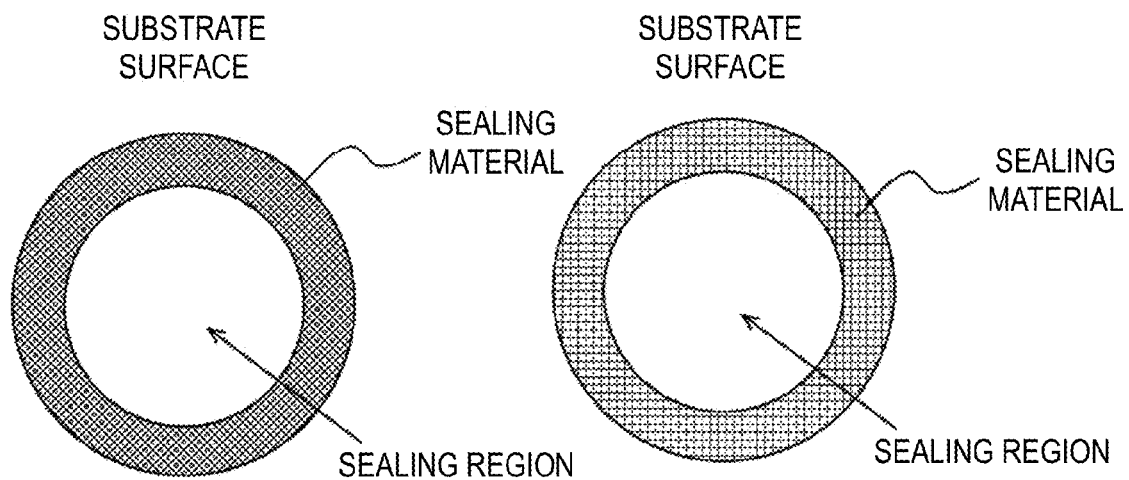
FIG. 3 is a view illustrating a path of a mountain portion of a sealing material in plane view.
Figure 4:
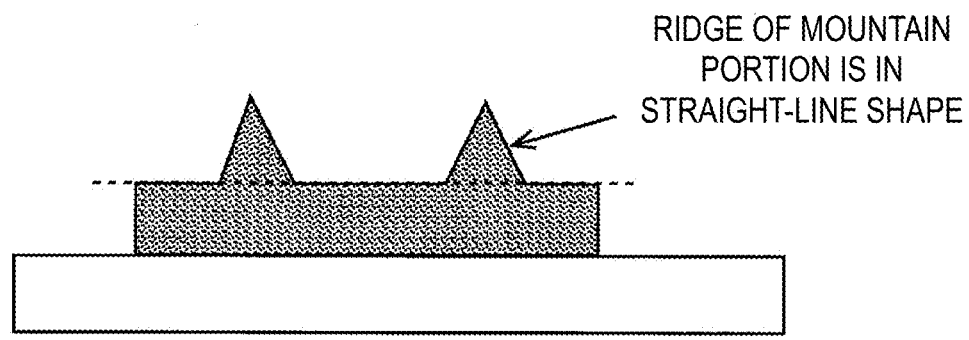
FIG. 4 is a view illustrating an example of a shape of a mountain portion of a sealing material having a base portion and the mountain portion.
Figure 4:
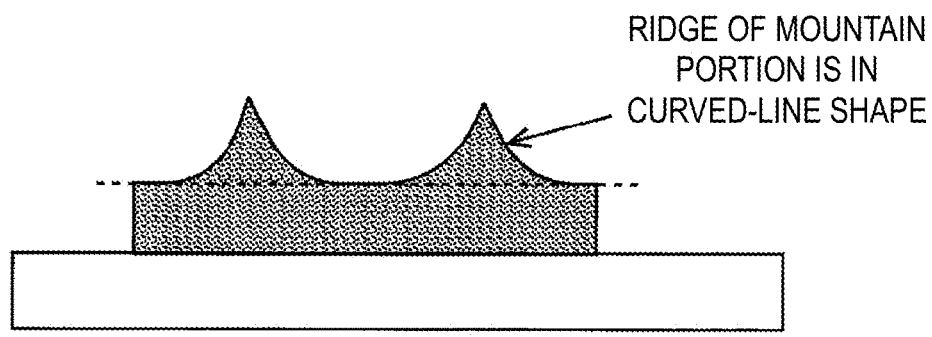
Figure 5:
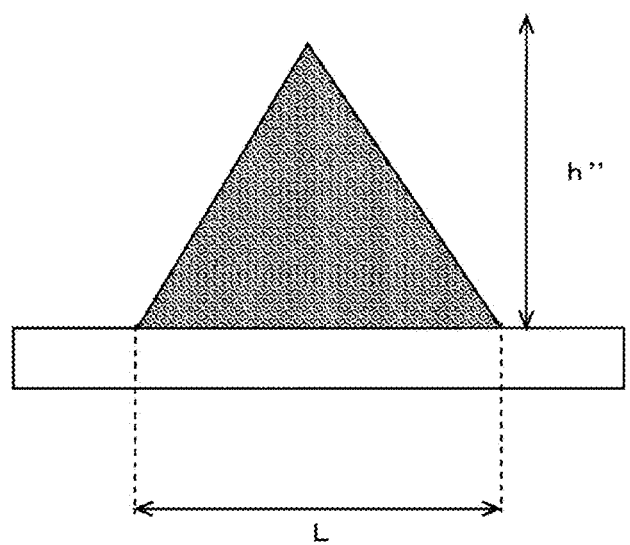
FIG. 5 is a view illustrating another cross-sectional shape (mountain portion having substantially a triangular shape) of a sealing material in the present invention.
Figure 6:
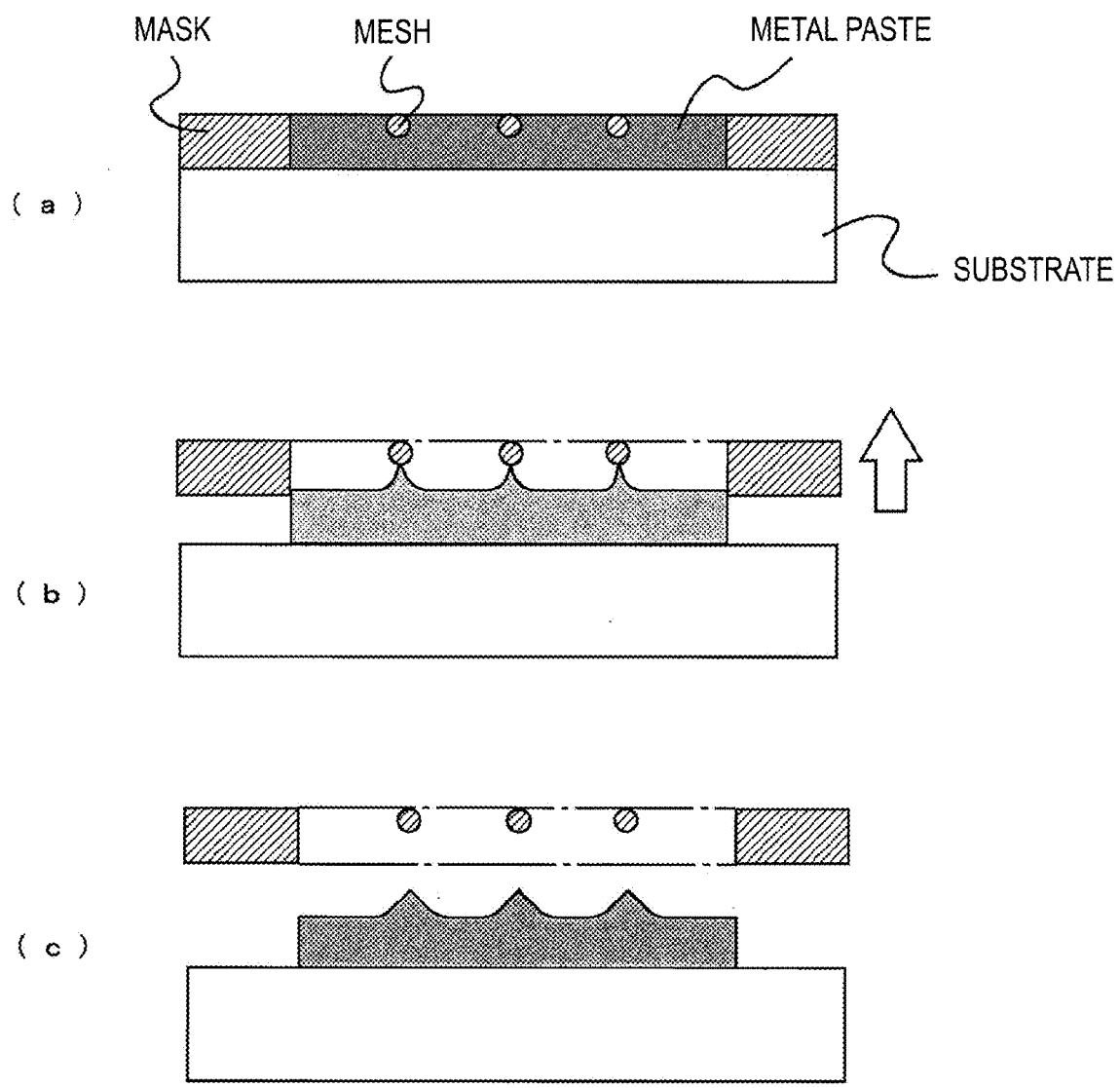
FIGS. 6(a) to 6(c) are views illustrating processes of forming a sealing material.

*1Cross-sectional shape is obtained by cutting from the center of gravity of an inner surface of the sealing region to the outside in a horizontal direction
*2Pressing load is a load against an entire surface of a wafer (having diameter of 4 inches)
*3No. 6, 7, 9, 11, and 13 are conventional examples and have a sealing material having a flat upper surface
*4In the embodiments, since the shape of the mountain portion is uneven as illustrated in FIG. 6, the maximum height (apex portion) and minimum height (ridge portion) were indicated From Table 1, in the conventional example, the sealing region having sufficient airtightness can be formed when the pressing load is 12 kN (No. 6), but leak occurs and sealing is insufficient when the pressing load is lowered to 7.2 kN (No. 7). That is, since the sealing material of the conventional example has the flat upper surface and an area of the sealing material is 120 mm² (having a width of 0.3 mm, a pattern shape of 10 mm-square, and 10 sealing regions), it means that the sealing can be achieved at a pressure of 100 MPa (12 kN), but the leak occurs at a pressure of 60 MPa (7.2 kN).

In contrast, the leak does not appear even in the pressing load of 7.2 kN in this embodiment and a sealing region having sufficient sealing performance can be formed while the load is reduced. That is, as a result of stress concentration on the mountain portion, metal powders are preferentially plastically-deformed and recrystallized near directly below of the mountain portion, thereby being densified, and thus it is understood that the hermetic-sealing is established at a low load compared to the conventional example where the entire surface of the sealing material needs to be pressed. However, when the metal powders constituting the sealing material is out of a preferred range in purity and particle size, a leak occurs, resulting in an insufficient result.

Second Embodiment

A sealing material was formed to have a cross section of only a triangular mountain portion in this embodiment, and sealing ability of the sealing material was confirmed. A sealing material was formed on the same substrate as in the first embodiment by use of a metal paste (No. 1) of the first embodiment. An arrangement pattern of the sealing material on the substrate was configured such that 100 sealing regions were formed in 10 mm-square with a width (bottom) of 20 μm.

Figure 8:
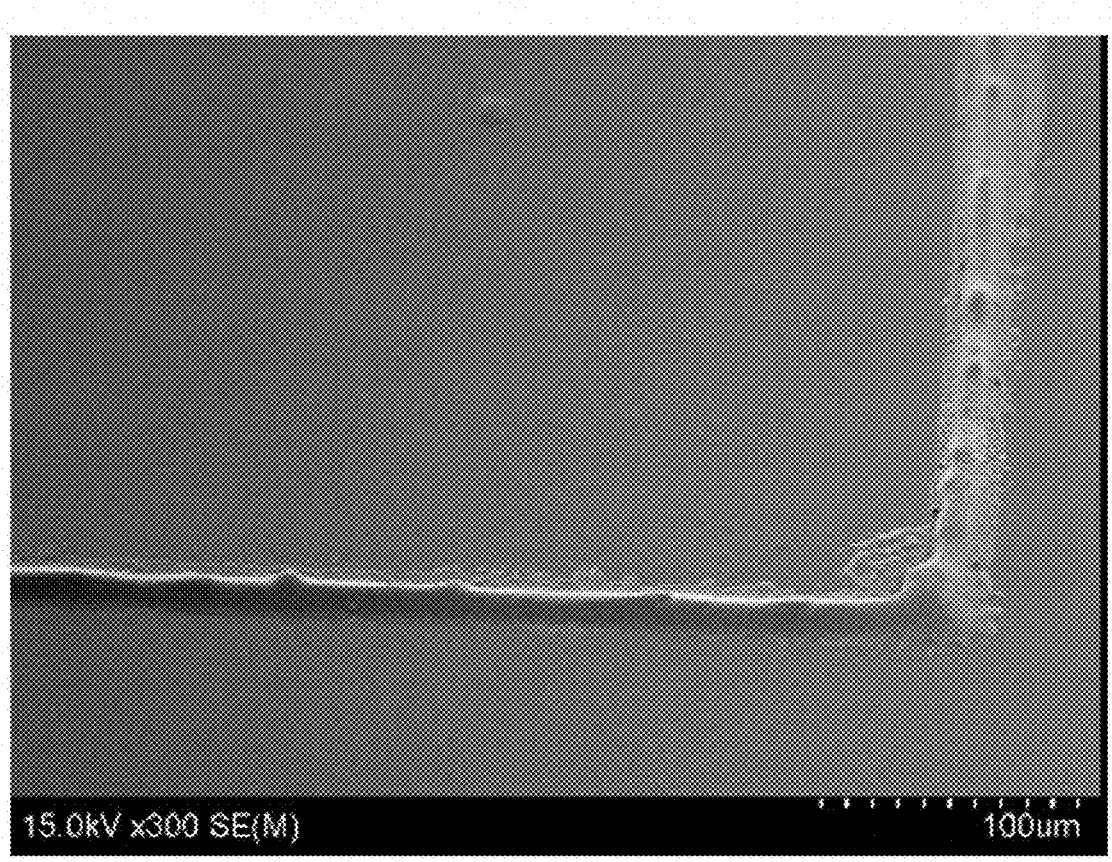
FIG. 8 is a photograph showing an appearance of a sealing material produced in a second embodiment.

Similarly to the first embodiment, a metal paste was applied through a screen mask (suspend metal mask), thereby forming a sealing material. In an ESP metal mask (Taiyo Kagaku Corporation) used herein, an Ni foil has a thickness of 24 μm and is provided with meshes of a hole density of 325, which are woven by metal wires having a diameter of 16 μm, on an upper surface of an opening, wherein an opening of a hole is 53 μm. FIG. 8 shows an appearance of the sealing material formed in this embodiment. The sealing material had a width of a bottom of 20 μm an apex height of 4 to 7 μm, and a ratio (h″/L) of a height (h″) of a mountain portion to a length (L) of the bottom was 0.2 to 0.4.

The package member was hermetically sealed by bonding to a wafer in the same manner as in the first embodiment. Thereafter, a leak test was performed, and helium leak was in the range of $10^{-11}$ to $10^{-13}$ Pa·m³/s, which was acceptable.

INDUSTRIAL APPLICABILITY

The present invention is intended to solve the problem of the increase in the pressing load, which may be caused at the time of production of the hermetically-sealed package in which the plurality of sealing regions are set on the substrate. In the present invention, reliable hermetic-sealing can be obtained while the pressing load is reduced, a plurality of regions can be hermetically-sealed by a relatively simple process, and thus the present invention can be expected to be applied to a wafer level package.

The invention claimed is:

1. A hermetic-sealing package member comprising a substrate and at least one frame-like sealing material for defining a sealing region formed on the substrate, wherein
   the sealing material is formed of a sintered body obtained by sintering of at least one metal powder selected from gold, silver, palladium, or platinum having a purity of 99.9 wt % or greater and an average particle size of 0.005 μm to 1.0 μm, and
   the sealing material is formed such that a shape of an arbitrary cross-section toward an outside from the sealing region includes a base portion having a certain height and at least one mountain portion protruding from the base portion, and a length of an upper end of the sealing material is shorter than a length of a lower end.

2. The hermetic-sealing package member according to claim 1, wherein a ratio (h'/h) of a height (h') of the mountain portion to a height (h) of the base portion of the sealing material in the arbitrary cross-section is 0.2 to 5.0.

3. The hermetic-sealing package member according to claim 1, wherein a path traced by an apex of the mountain portion is a net shape or a grid shape when being viewed in a plane parallel to a planar surface of the substrate.

4. A production method for the hermetic-sealing package member defined in claim 1, comprising the steps of:
   placing a mask having a mesh-like opening on a surface of a substrate;
   applying a metal paste containing at least one metal powder selected from gold, silver, palladium, or platinum having a purity of 99.9 wt % or greater and an average particle size of 0.005 μm to 1.0 μm and a solvent, filling the metal paste in the opening, and then pulling out the mask; and
   forming a sealing material formed of a sintered body by firing of the metal paste.

5. The production method for the hermetic-sealing package member according to claim 4, wherein the metal paste has a thixotropy index (TI) value of 3 to 15 which is calculated from a measurement value of viscosity at a shear rate of 4/s with respect to viscosity at a shear rate of 40/s at 23° C. by use of a rotation viscometer and viscosity of 30 to 1000 Pa·s at a shear rate of 4/s.

6. A production method for a hermetically-sealed package using the hermetic-sealing package member defined in claim 1, comprising the steps of:
   overlapping the substrate of the hermetic-sealing package member and another substrate through a sealing material to each other; and densifying the sealing material by heating at 80 to 300° C. and pressing in one direction or both directions.

7. The hermetic-sealing package member according to claim 2, wherein a path traced by an apex of the mountain portion is a net shape or a grid shape when being viewed in a plane parallel to a planar surface of the substrate.

8. A production method for the hermetic-sealing package member defined in claim 2, comprising the steps of:
   placing a mask having a mesh-like opening on a surface of a substrate;
   applying a metal paste containing at least one metal powder selected from gold, silver, palladium, or platinum having a purity of 99.9 wt % or greater and an average particle size of 0.005 μm to 1.0 μm and a solvent, filling the metal paste in the opening, and then pulling out the mask; and
   forming a sealing material formed of a sintered body by firing of the metal paste.

9. A production method for the hermetic-sealing package member defined in claim 3, comprising the steps of:
   placing a mask having a mesh-like opening on a surface of a substrate;
   applying a metal paste containing at least one metal powder selected from gold, silver, palladium, or platinum having a purity of 99.9 wt % or greater and an average particle size of 0.005 μm to 1.0 μm and a solvent, filling the metal paste in the opening, and then pulling out the mask; and
   forming a sealing material formed of a sintered body by firing of the metal paste.

10. A production method for a hermetically-sealed package using the hermetic-sealing package member defined in claim 2, comprising the steps of:
    overlapping the substrate of the hermetic-sealing package member and another substrate through a sealing material to each other; and densifying the sealing material by heating at 80 to 300° C. and pressing in one direction or both directions.

11. A production method for a hermetically-sealed package using the hermetic-sealing package member defined in claim 3, comprising the steps of:
    overlapping the substrate of the hermetic-sealing package member and another substrate through a sealing material to each other; and densifying the sealing material by heating at 80 to 300° C. and pressing in one direction or both directions.

12. A hermetic-sealing package member comprising a substrate and at least one frame-like sealing material for defining a sealing region formed on the substrate, wherein
    the sealing material is formed of a sintered body obtained by sintering at least one metal powder selected from gold, silver, palladium, or platinum having a purity of 99.9 wt % or greater and an average particle size of 0.005 μm to 1.0 μm, and
    the sealing material is formed such that a shape of an arbitrary cross-section toward an outside from the sealing region includes a mountain portion having substantially a triangular shape in which a length of a lower end of the sealing material is a bottom, and a length of an upper end of the sealing material is shorter than the length of the lower end.

13. The hermetic-sealing package member according to claim 12, wherein a ratio (h″/L) of a height (h″) of the mountain portion of the sealing material in the arbitrary cross-section to a length (L) of the bottom is 0.1 to 3.0.

14. A production method for the hermetic-sealing package member defined in claim 12, comprising the steps of:
    placing a mask having a mesh-like opening on a surface of a substrate;
    applying a metal paste containing at least one metal powder selected from gold, silver, palladium, or platinum having a purity of 99.9 wt % or greater and an average particle size of 0.005 μm to 1.0 μm and a solvent, filling the metal paste in the opening, and then pulling out the mask; and
    forming a sealing material formed of a sintered body by firing of the metal paste.

15. A production method for the hermetic-sealing package member defined in claim 13, comprising the steps of:
    placing a mask having a mesh-like opening on a surface of a substrate;
    applying a metal paste containing at least one metal powder selected from gold, silver, palladium, or platinum having a purity of 99.9 wt % or greater and an average particle size of 0.005 μm to 1.0 μm and a solvent, filling the metal paste in the opening, and then pulling out the mask; and
    forming a sealing material formed of a sintered body by firing of the metal paste.

16. A production method for a hermetically-sealed package using the hermetic-sealing package member defined in claim 12, comprising the steps of:
    overlapping the substrate of the hermetic-sealing package member and another substrate through a sealing material to each other; and densifying the sealing material by heating at 80 to 300° C. and pressing in one direction or both directions.

17. A production method for a hermetically-sealed package using the hermetic-sealing package member defined in claim 13, comprising the steps of:
    overlapping the substrate of the hermetic-sealing package member and another substrate through a sealing material to each other; and densifying the sealing material by heating at 80 to 300° C. and pressing in one direction or both directions.

* * * * *